United States Patent [19]
Gibb

[11] Patent Number: 5,856,783
[45] Date of Patent: Jan. 5, 1999

[54] PUMP CONTROL SYSTEM

[75] Inventor: Robert F. Gibb, San Diego, Calif.

[73] Assignee: Raptor, Inc., San Diego, Calif.

[21] Appl. No.: 605,528

[22] Filed: Feb. 22, 1996

Related U.S. Application Data

[63] Continuation-in-part of Ser. No. 195,264, Feb. 14, 1994, abandoned, which is a continuation-in-part of Ser. No. 167,568, Dec. 14, 1993, Pat. No. 5,463,378, which is a continuation of Ser. No. 763,990, Sep. 23, 1991, Pat. No. 5,287,086, which is a continuation-in-part of Ser. No. 459,546, Jan. 2, 1990, abandoned.

[51] Int. Cl.$^6$ ................................................ G08B 21/00
[52] U.S. Cl. .......................... 340/618; 340/612; 340/620; 73/304 C; 73/304 R; 331/64; 331/65; 324/660; 324/674
[58] Field of Search ..................................... 340/618, 620, 340/612; 73/304 C, 304 R, 290 R, 302; 331/64, 65; 324/660, 674, 681

[56] References Cited

U.S. PATENT DOCUMENTS

| | | | |
|---|---|---|---|
| 3,375,716 | 4/1968 | Hersch | 73/304 |
| 3,553,575 | 1/1971 | Shea | 73/304 C |
| 3,588,859 | 6/1971 | Petree | 340/244 |
| 3,646,541 | 2/1972 | Rethbum | 331/65 |
| 3,665,300 | 5/1972 | Sauer | 324/61 R |
| 3,894,290 | 7/1975 | Rose | 340/620 |
| 4,053,398 | 10/1977 | Venema | 210/41 |
| 4,083,248 | 4/1978 | Maier | 73/304 C |
| 4,129,501 | 12/1978 | Haynes | 340/604 |
| 4,145,927 | 3/1979 | Larson | 73/304 C |
| 4,199,984 | 4/1980 | Huddart et al. | 73/304 C |
| 4,259,865 | 4/1981 | Myers | 73/304 C |
| 4,270,049 | 5/1981 | Tanaka et al. | 250/227 |
| 4,515,015 | 5/1985 | Kuhlman | 73/304 C |
| 4,523,460 | 6/1985 | Stickler et al. | 73/200 |
| 4,583,402 | 4/1986 | Myers et al. | 73/304 C |
| 4,800,755 | 1/1989 | Fathauer et al. | 73/304 C |
| 4,875,497 | 10/1989 | Worthington | 137/2 |
| 5,017,909 | 5/1991 | Goekler | 340/620 |
| 5,305,779 | 4/1994 | Izaguirre | 137/172 |
| 5,330,073 | 7/1994 | Collins et al. | 222/52 |

*Primary Examiner*—Jeffery Hofsass
*Assistant Examiner*—Edward Lefkowitz
*Attorney, Agent, or Firm*—William Patrick Waters

[57] ABSTRACT

A pump control system which can distinguish between water and oil so that a pump can be controlled to pump water and deactivated before oil is pumped. Sensing is accomplished by a pair of capacitive sensors, one located above the other in a vessel in which water accumulates. A dual mode frequency oscillator is associated with each sensor. Each sensor reacts to the dielectric constant of the liquid at the sensor by changing its capacitance, to thus detect the presence of a conductive substance, such as a liquid, to cause the sensor's oscillator to switch its mode of oscillation. The dual mode oscillator of each sensor selectively generates a control signal having two different duty cycles. As the dielectric constant of the liquid medium is sensed, a logic circuit interposed between the sensors allows the output of each sensor to be turned off when only the lower sensor is in water. The circuit turns on the pump only when both sensors are in water and the pump remains on until both sensors are out of water. An adjustable deadband is provided, thereby avoiding having the pump turning on and off with a slight water level change. Each sensor detects the difference between dielectric constants of air and of oil, in relation to that of water. As a result, the pump control system differentiates between water and oil and activates the system to pump water while deactivating the system before oil on the water surface is pumped.

10 Claims, 5 Drawing Sheets

PUMP CONTROL SYSTEM

CROSS-REFERENCE TO RELATED APPLICATIONS

This application is a continuation-in-part of U.S. patent application Ser. No. 08/195,264, filed Feb. 14, 1994, entitled "Pump Control System and Method of Using Same", now abandoned, which is a continuation-in-part of U.S. patent application Ser. No. 08/167,568, filed Dec. 14, 1993, entitled "Proximity Detection System and Oscillator and Method of Using Same", now Pat. No. 5,463,378, which is a continuation patent application of U.S. patent application Ser. No. 07/763,990, filed Sep. 23, 1991, entitled "Proximity Detection System and Oscillator", now Pat. No. 5,287,086, which is, in turn, a continuation-in-part application of U.S. patent application Ser. No. 07/459,546, filed Jan. 2, 1990, entitled "Variable Impedance Sensor", now abandoned.

TECHNICAL FIELD

The present invention relates in general to pump controllers and methods of using them. It more particularly relates to a system for controlling a pump in the presence of immiscible liquids such as water and oil.

BACKGROUND ART

Some of the limitations of prior art proximity detectors have been discussed in my U.S. Pat. Nos. 5,287,086 and 5,463,378, each of which being incorporated herein by reference, in which handling unwanted water accumulation in the bilge of a ship is discussed. In the case of marine vessels, pumping of the bilge sometimes results in polluting the environment with oil which is pumped from the bilge along with the water.

In addition to the problems posed in pumping marine bilges in an environmentally proper manner, there are other situations where removal of accumulated water is complicated by factors which significantly reduce the utility of conventional pump controllers.

An example is seen in underground utility vaults containing electrical devices charged with high levels of electrical energy. In some cases, the underground vaults are located near greenbelts, golf courses or in open areas where rainwater or irrigation water can enter the vault. Water accumulated in the vault can cause a potential for shorting electrical devices and in general, can represent a dangerous condition. Thus, it is desirable to prevent vault water from rising above a predetermined level. In this regard, a typical underground vault will have a sump for accumulating water, utilizing conventional methods for removing the water from the sump. Usually, the water is raised to street level where it can be directed into a sewer system. The problem presented by this technique is similar to that of pumping a bilge since oil is sometimes pumped with the water.

Oil is utilized as an electrical insulating agent interposed between high electrical energy switches and metal housing in underground electrical vaults. Over time, as a result of such factors as changing stresses in the earth surrounding the vault, the oil leaks into the vault sump to become layered over the surface of accumulated water.

The relative volumes of oil and water vary from case to case depending on how much oil leakage into the sump is occurring and how much water is invading the vault. Over time, accumulated water and oil results in the sump liquid rising to unacceptable levels.

In conventional systems, when unwanted sump liquids rise to a predetermined level, a float or similar device activates a pump to remove the liquid. In this technique, oil is pumped out of the vault with the water. This presents serious problems in some cases where communities, sensitive to environmental concerns, prohibit the introduction of oil into sewer systems. As a result, the utility company responsible for vault operation is presented with a dilemma. On the one hand, it must remove accumulated water from the electrical vaults while, on the other hand, it is constrained from pumping out vault liquids if oil is one of the liquids.

In an attempt to solve the dilemma, labor intensive techniques are sometimes employed. For example, in some cases where vault liquid accumulation is suspected, a utility company employee is dispatched to enter the vault to insure that, if the pump is activated, no accumulated oil will be pumped out with the water. This inspection process can expose the employee to a dangerous condition requiring entry into a confined space, in the presence of high electrical potential and water. In recognition of the potential danger involved, utility company practices sometimes require a second employee, and in some cases, a third, to be present to monitor the condition of the one in the vault. Such practices are expensive, time consuming and inefficient.

Further complicating the plight of those charged with keeping electrical vaults in a safe and environmentally acceptable condition is that, some community officials, alarmed at the prospect of oil entering the sewer system, have proposed banning the pumping of vault liquids into local sewers.

In cases where bans are implemented, undesirable techniques of vault liquid removal, such as manual bailing or pumping to a transport truck, are sometimes utilized These techniques, while environmentally acceptable, can be expensive, inconvenient and inefficient. Thus, a need exists for a system for removing water from an electrical vault in an environmentally acceptable manner which would reduce or eliminate the need for visual inspection of the vault prior to pumping and would not require transportation of liquids to a remote disposal site.

While conventional devices, disclosed, for example, in U.S. Pat. Nos. 3,553,575; 3,894,240; 3,646,541; 4,053,398; 4,129,501; 4,270,049; 4,523,960 and 5,330,073, none of them represent a solution to the problems set forth above.

In view of the foregoing, it would be advantageous to have a system for removing oil covered water from a vessel, while preventing pumping of the oil. Desirably, such a system would operate with minimal supervision in bilges of marine vessels, underground electrical vaults and other spaces where accumulated water must be removed.

DISCLOSURE OF INVENTION

The principal object of the present invention is to provide a system for controlling a pump to remove water from a vessel while disabling the pump to prevent pumping of oil.

Another object of the present invention is to provide a pump control system which is effective and efficient in operation, and which is inexpensive to manufacture.

Still another object of the present invention is to provide a pump control system and method for removing accumulated water from vessels in an environmentally acceptable manner.

With the above stated objects in view, while finding additional uses for and experimenting with the capacitive sensor disclosed in my aforementioned patents, I discovered that the sensor is capable of distinguishing between air, oil and water. In making this discovery, I realized that water, oil and air each have a different dielectric constant. Air has a dielectric constant of 1, oil a dielectric constant of 2.4, and water has a dielectric constant of 80. As such, air and oil, which have very low dielectric constants are, for all practical purposes, non-conductive, whereas water, having a very high dielectric constant, is highly conductive. The sensor of my invention is a capacitive device, the capacitance of which changes, from a very high value in the presence of a conductive liquid with a very high dielectric constant, to a very low value in the presence of either oil or air, each of which has a very low dielectric constant. Thus, it can be seen that the sensor of my invention, by changing its capacitance, can distinguish between the dielectric constants of air and oil in relation to the dielectric constant of water.

Briefly, the above stated objects are realized in accordance with the present invention by providing a pump control system which can distinguish between water and oil so that a pump can be controlled to pump water and to be deactivated before oil layered on the water surface is pumped.

Sensing is accomplished in the pump control system of the present invention by a pair of capacitive sensors, one located above the other in a sump or vessel in which water can accumulate. A dual mode frequency oscillator is associated with each sensor. Each sensor reacts to the dielectric constant of the liquid at the sensor by changing its capacitance, to thus detect the presence of a conductive substance, such as a liquid, to cause the sensor's oscillator to switch its mode of oscillation. The dual mode oscillator of each sensor selectively generates a control signal having two different duty cycles. As the dielectric constant of the liquid medium is sensed, a logic circuit interposed between the sensors allows the output of each sensor to be turned off when both sensors are free from water and to remain off when only the lower sensor is in water.

The circuit turns on the pump only when both sensors are in water and the pump remains on until both sensors are out of water. An adjustable deadband is provided, thereby avoiding having the pump turning on and off with a slight water level change. As previously mentioned, each sensor is capable of reacting to the difference between the dielectric constants of air, oil and water. As a result, the pump control of the present invention differentiates between oil and water and activates the system to pump water, while deactivating the system before oil on the water surface is pumped.

The sensors and the logic circuit are encapsulated sealingly within a corrosion resistant, electrically nonconductive material, to help prevent damage from moisture when disposed in a vault sump. With this arrangement, the entire system is corrosion resistant, has no moving parts, and can be quickly and easily mounted in an operating position.

The pump control system of the present invention presents several advantages. Principally, it affords a technique for removing unwanted water in a bilge or vault efficiently and effectively, without pumping oil disposed on the water surface. In this regard, the present invention satisfies environmental considerations while reducing labor costs.

In addition, the present invention is inexpensive to manufacture and reliable and responsive in operation.

BRIEF DESCRIPTION OF DRAWINGS

The above mentioned and other objects and features of this invention and the manner of attaining them will become apparent, and the invention itself will be best understood, by reference to the following description of the embodiment of the invention in conjunction with the accompanying drawings, wherein.

BEST MODE FOR CARRYING OUT THE INVENTION

In summary, the control system of the present invention utilizes two sensors, one to sense water level for pump turn on and the other to control the point at which the pump is turned off. The sensors detect only water and are blind to air and to oil which might be covering the water. The sensors are connected to a logic circuit that functions so that when the water level reaches an upper sensor, the pump turns on and water is pumped until the lower sensor no longer senses water. When the lower sensor is uncovered, the pump is turned off and it stays off until the upper sensor is again covered by water. The sensing circuitry of the present invention enables differentiation among air, oil and water, so that elimination of water in a sump can be accomplished without pumping the oil on the water surface.

In the control system of the present invention, the logic circuit permits an input to the pump to be turned off when both low level and high level sense areas are free from water. The input to the pump will remain off when only the lower sensor is in water and to turn on when both sensors are in water and remain on until both sensors are out of water. The distance between upper and lower sensors can be varied and may be determined by factors such as sump volume and rate of water accumulation. In this regard, the distance between upper and lower sensors provides a large deadband that prevents the pump from turning on and off with a slight change in liquid level.

The circuit of the present invention utilizes a dual mode RC quasi square wave oscillator that is connected to a conductive plate that forms one plate of a capacitive sensor. This plate is separated and insulated from the fluid to be detected by a non conductive material, such as plastic. A conductive liquid (such as water which has a high dielectric constant) forms the other plate of the capacitive sensor. When a conductive liquid comes into contact with the plastic isolating material, the capacity formed between the plates of the capacitive sensor is increased, thereby causing the oscillator to oscillate in its second mode with a substantially different duty cycle. This change is detected and used to control an output signal.

Figure 1:
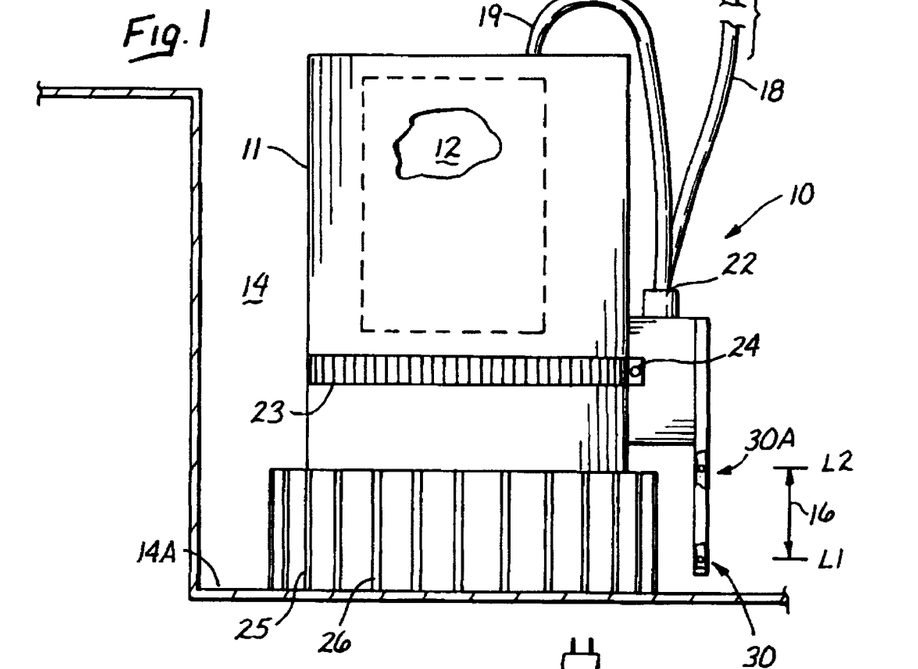
FIG. 1 is a side view of the present invention showing the present invention attached to a pump.

Referring now to the drawings, and more particularly to FIG. 1, there is shown a pump control system 10 which is constructed in accordance with the present invention. The system 10 is attached to the housing of a submersible pump 11 which is installed in a sump 14 of an underground electrical vault. While the system is shown and described for sensing and controlling water buildup in an underground electrical utility vault, it will be apparent to those skilled in the art that the system 10 may also be employed in other different applications where immiscible fluids are present and it is desirable to remove but one. Thus, for example, the present invention has utility in the removal of water from a container where oil is layered on the surface of the water and it is desirable to leave the oil behind.

In a preferred embodiment of the invention, the system 10 enables continual control of water level in a sump by activating a motor 12 of the submersible pump 11 to discharge an unwanted accumulation of water. A novel characteristic of the system 10 is the capability of activating a pump to remove water while deactivating the pump before pumping oil which may be present on the surface of the water.

Referring now to FIG. I, the pump control system 10 includes a watertight container 15 having a lead 18 connecting the system 10 to an electrical power source (not shown) while a lead 19 electrically couples the system 10 drivingly to the pump motor 12. Watertight feed throughs 21 and 22 provide a watertight seal for the leads 18 and 19, respectively, where the leads pass through the container 15.

While it will be recognized that the system 10 could be readily incorporated within a pump housing, in the embodiment shown in FIG. 1, the system 10 is separate from the pump 11 and secured thereto by an adjustable strap 23, fixed to the container 15 by conventional means, such as by a pin 24. In operation of the system 10, water flows into a plurality of pump intakes, such as the intakes 25 and 26, to be pumped out of the vault.

Figure 2:
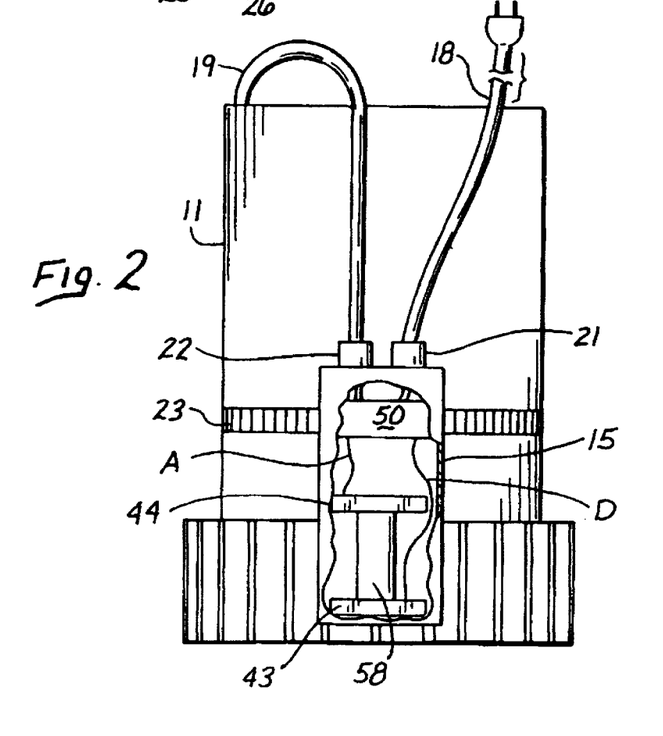
FIG. 2 is a front view of the invention of FIG. 1 having a broken away portion to show sensors and control circuit.

As shown in FIG. 2, the container 15 encloses a lower sensor 30 and an upper sensor 30A, each being fixed to a support 58 in a spaced apart relationship. The sensor 30A is disposed at a predetermined distance above the sensor 30 thereby defining the upper and lower limits of a deadband 16. Each of the sensors 30 and 30A includes a conductive metal plate, such as the plates 43 and 44, respectively, each one of which forms one half of a capacitor for sensing the presence and absence of water. As stated, the sensors 30A and 30 define, respectively, the upper and the lower limits of the deadband 16. It will be readily apparent that the height of the deadband 16 can be adjusted by changing the distance between the sensors 30 and 30A on the support 58.

As water accumulates in the sump 14, its level rises from a level indicated generally (FIG. 1) as L1, at the low end of the deadband 16, to a level indicated generally as L2, at the high end. In this case, the system 10 detects the rise in the water level and causes an ON control signal to be generated for activating the pump motor 12. Upon pump activation, water is discharged from the pump until the water recedes to the level L1.

In practice, it is suitable for the lower level of the deadband 16 to be about two inches from a sump floor 14A while the upper limit of the deadband 16 is about six inches above the sump floor.

Figures 3, 4, 6:
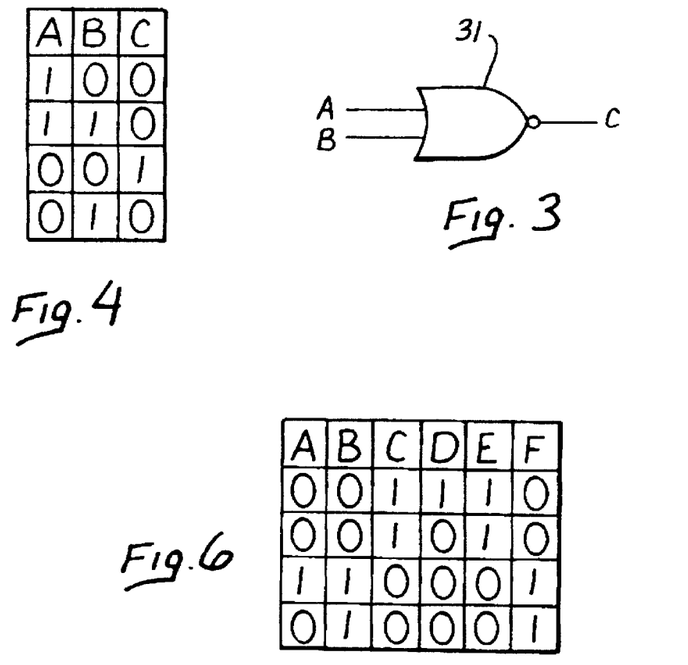
FIG. 3 depicts a dual input Nand gate.
FIG. 4 depicts a truth table for a dual input Nand gate.
FIG. 6 depicts a truth table for a latch circuit.

Referring now to FIGS. 3 through 7, the circuit functions of the system 10 may be considered. The logic elements of the system 10 are comprised of two sections of a CD 4001 quad CMOS dual input Nand gate, a representative Nand gate 31 being shown in FIG. 3. The Nand gate 31 is a logic circuit having two or more inputs, such as inputs A and B, and an inverted output, such as output C. A truth table, set forth in FIG. 4, shows possible input and output conditions of the Nand gate 31 wherein 0 equals logic low and 1 equals logic high.

Figure 5:
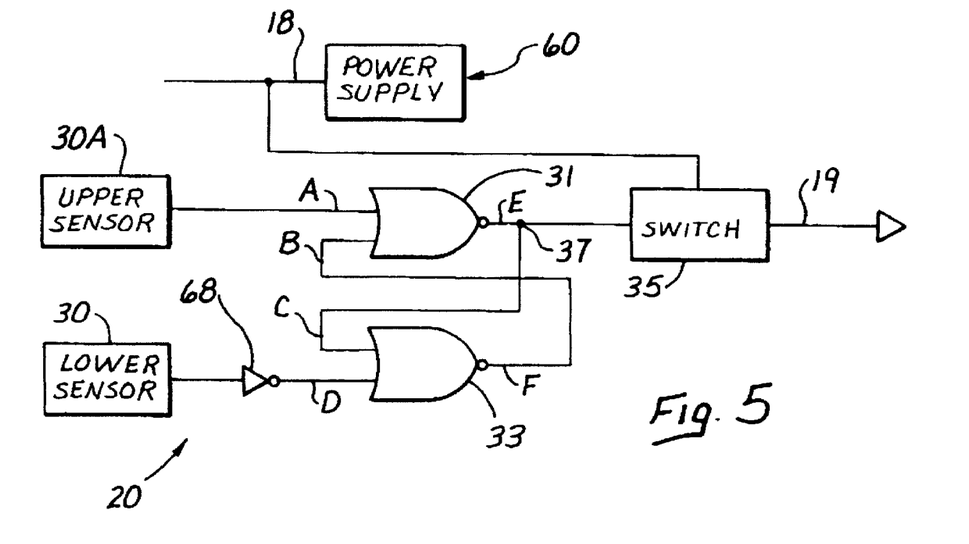
FIG. 5 depicts a Nand gate logic circuit.

Referring now to FIG. 5, to form a latch circuit in which a Nand gate logic circuit 20 is depicted, the Nand gate 31 is connected to a Nand gate 33. The Nand gate 33 is similar in construction and function to the Nand gate 31. Inputs to the Nand gates 31 and 33 are derived from the sensors 30 and 30A whereby Nand gate 31 receives a signal from the sensor 30A via a first input A and Nand gate 33 receives a signal from the sensor 30 via inverter 68 and its first input D. It will be noted, with reference to FIG. 5, that the output of the Nand gate 31 is connected at a node 37 to a lead C and to a lead E. The lead C electrically connects to a second input C of Nand gate 33 while the lead E electrically connects a switch 35. The switch 35 is preferably a bidirectional, triac, avalanche device. An output F of Nand gate 33 is connected to a second input B of Nand gate 31.

As shown in FIG. 5, interposed between the circuit 65 and the latch 20 is an inverter 68. The output of the latch 20 connects to a switch and driver 71. It has been found that a switch, such as a triac switch 35, is suitable. During system 10 operation, the lead 19 delivers an activating electrical signal from the triac switch 35 to the pump motor 12.

With reference now to FIG. 6, during operation of the system 10, when both the upper sensor 30A and the lower sensor 30 are not covered by water, the input A is 0 and the input D, via the inverter 68, is 1. Since gate input D is 1, from the truth table of FIG. 4, it will be seen that output F is 0. This places a 0 on both inputs A and B, causing the output E and input C to each be a 1. The output E, in this case, disables the switch 35 controlling the pump motor 12 to prevent the pump from running while applying a 1 to input C. As water level rises, the lower sensor 30 becomes covered by water (which has a high dielectric constant) and 0, via the inverter 68, is placed on the input D. Now, since C is a 1 and D is a 0, output F will be 0 and the motor 12 will still not turn on.

When the water level reaches the upper sensor 30A, the output of that sensor goes to 1. Thus, with 1 at the A input and 0 at the B input, the output E will go to 0 and the switch 35 will be enabled to cause the pump motor 12 to start the pump. As the pump lowers the level of the water below the upper sensor 30A, the input A will again go to 0. In this case, however, the pump 11 will remain on since the output F is 1 in view of the fact that its inputs are both 0. The water will thus be pumped down to the level 1 where the lower sensor 30 is out of the water. At this point, the sensor 30 output again goes to 1 because of the change in the dielectric constant between water and air or oil, the latter which may be on the surface of the water. This change causes the input C to be 1 and the output F to be 0. This places 0 on both the inputs A and B, resulting in the output E going again to 1 and the pump 11 to turn off. Thus, it will be seen that the deadband 16 is controlled by the separation of the sensors 30 and 30A.

Figure 7A:
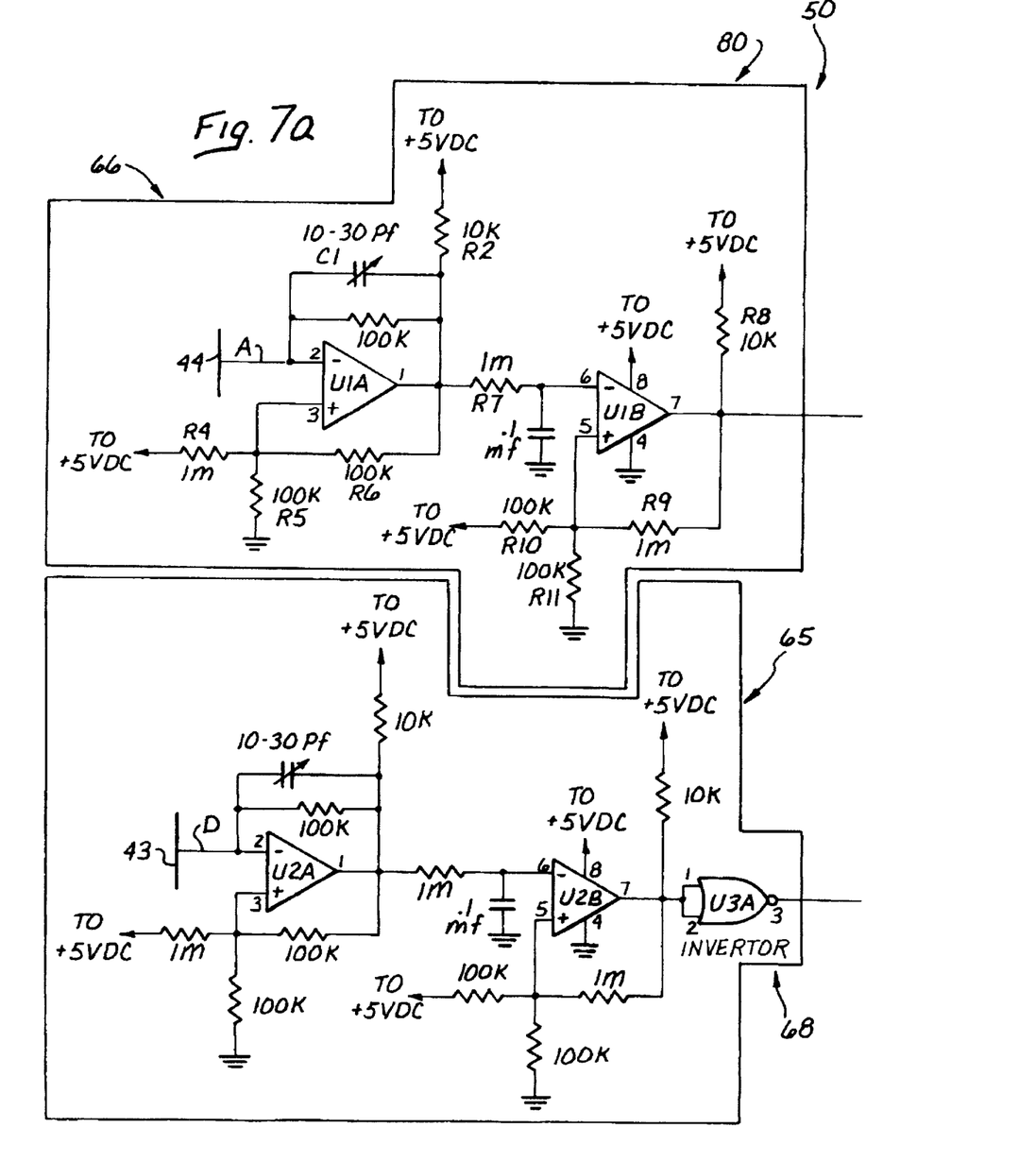
FIGS. 7a and 7b is a schematic depiction of a control circuit of the present invention.
Figure 7B:
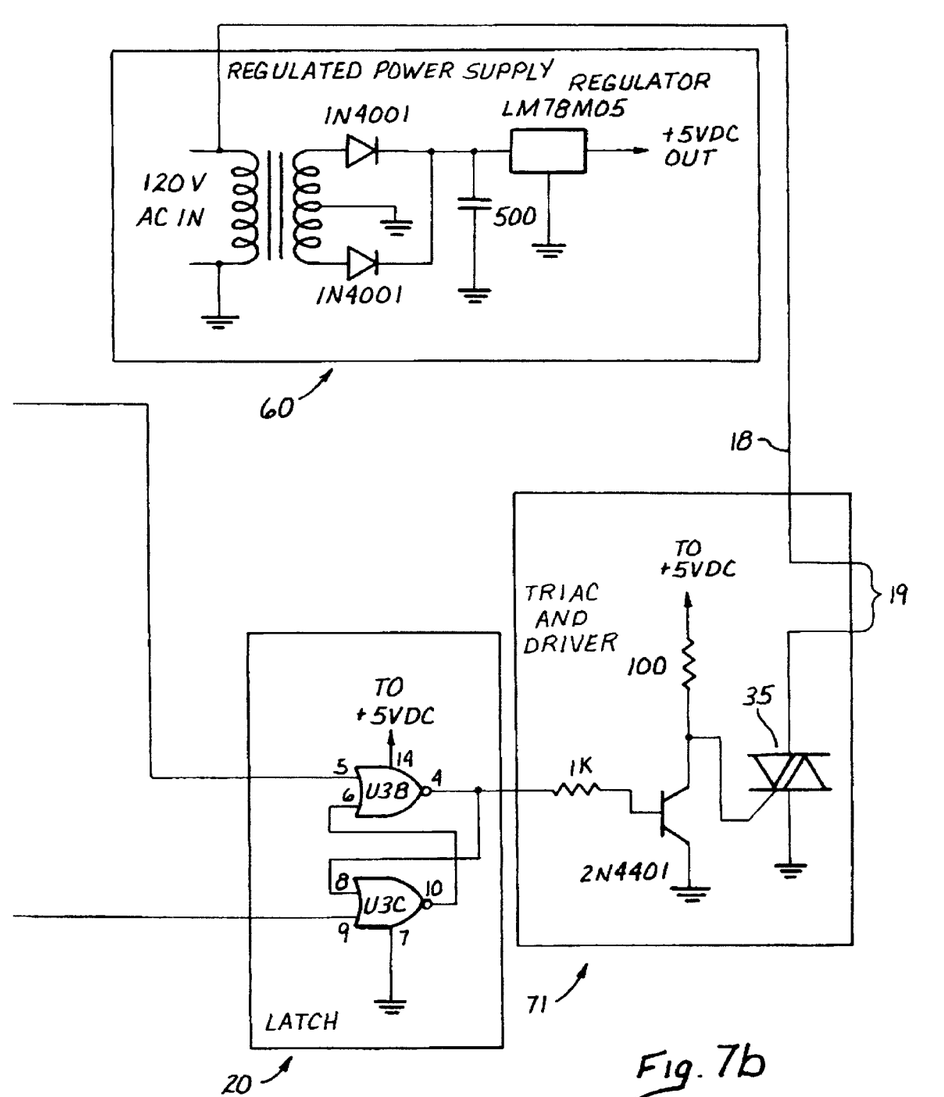

Referring now to FIGS. 7a and 7b, there is depicted a system 10 control circuit 50. The circuit 50 includes a regulated power supply 60 and a pair of proximity sensor circuits 65 and 66 which comprise the circuitry for the sensors 30 and 30A respectively. It will be noted that the structure and function of the proximity sensor circuits 65 and 66 are similar to the proximity detector of aforementioned U.S. Pat. Nos. 5,287,086 and 5,463,378, each of which is incorporated herein by reference.

With further regard to the proximity sensor circuit 66, there is depicted in FIG. 7a a dual comparator 80 in which operational amplifier U1A is one half. Amplifier U1A functions as a dual mode oscillator. Operational amplifier U1B is the other half of the dual comparator and functions as a filter for the output signal from oscillator U1A. Resistors R4 and R5 form a voltage divider to set the voltage of U1A pin 3 at 1/10 the supply voltage, which in this case, is 0.5 volts. Resistor R1 and capacitor C1 connect the output from pin 1 of U1A to its inverting input at pin 2. Resistor R2 is the pull up resistor for the open collector output of the oscillator U1A.

When the metal plate 44 connected to pin 2 of U1A is not immersed in liquid through the insulating plastic, the capacitance of capacitive sensor 30A is very small. This is due to the sensor reacting to the very low dielectric constants of either oil or air. The mode of oscillation is formed by feeding back a signal from the output through C1 to the inverting input, pin 2. In this mode, the circuit oscillates as a phase shift oscillator, with the phase shift being supplied by the transit time of the operational amplifier U1A. This produces a signal having a frequency of approximately 1 megahertz and having a duty cycle with a long high state and a short low state. This produces a signal with an average DC component of approximately 3.5 volts.

With the insulated plate 44 of the sensor 30A immersed in a conductive liquid such as water, the capacitance of sensor 30A becomes very large causing the capacitance of capacitor C1 to become insignificant. In this case, the mode of oscillation is determined by the time constant formed by the capacitance of sensor 30A, which is created by the metal plate 44 and the conductive liquid, and as established by R1 and the offset voltage on pin 3 resistor R6. In this mode, the oscillator functions as an RC oscillator in which the duty cycle of the output signal has a short high state and long low state. This signal has a DC component of about 0.8 volts.

The resistor R7 is connected to the output of the oscillator to C2 and to the inverting input of the comparator and filter or integrator, U1B. These components form a low pass filter and a time delay to produce an integrated signal to the comparator U1B that is the DC component of the oscillator's output signal. R10 and R11 form a voltage divider to reference U1B pin 5 to about 2.5 volts. R9 supplies some positive feedback from the comparator output to create hysteresis so that the comparator will have a deadband and not be prone to indecision when switching. R8 is a pull up resistor for the open collector output of the comparator.

When the plate 44 of the capacitive sensor 30A is not immersed in a liquid having a high dielectric constant, and the DC component of the oscillator output signal is high, the output comparator section is switched low since the inverting input, pin 6, is a greater voltage than the non-inverting input, pin 5. When the plate 44 is immersed in a liquid having a high dielectric constant, the DC voltage at the inverting input is less than the voltage at the non-inverting input and the comparator output goes high.

While the circuitry and function of the circuit 66 for the upper sensor 30A have been described, it will be readily understood that a corresponding circuitry and function obtain with regard to the circuit 65, depicted in FIG. 7a.

Figure 8:
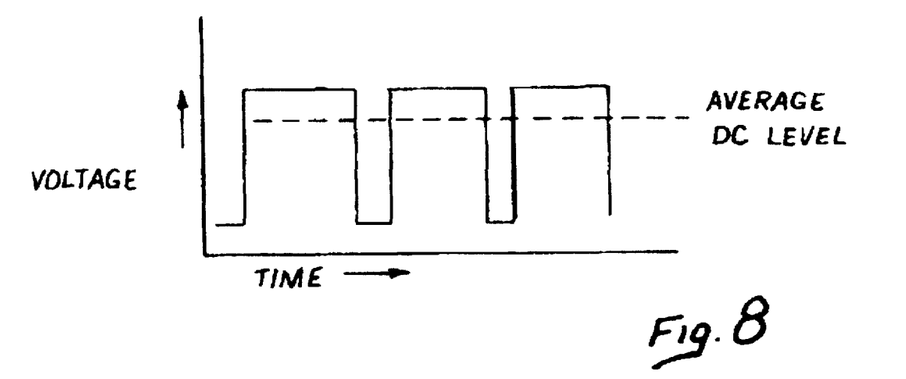
FIG. 8 is a waveform of oscillator output when no water is present.
Figure 9:
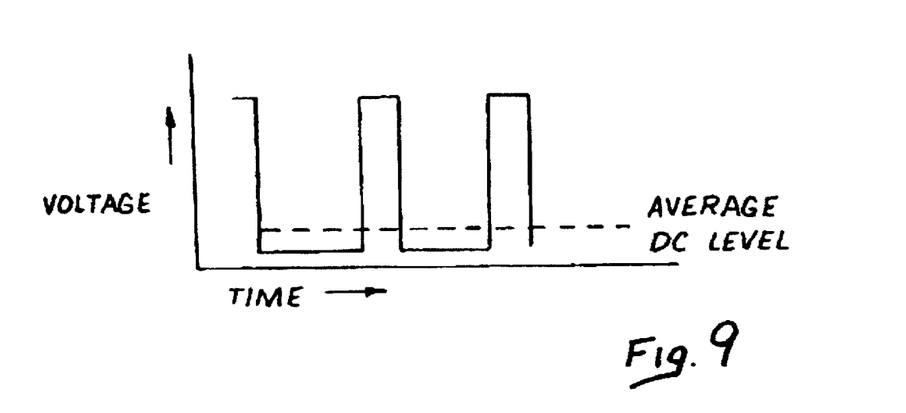
FIG. 9 is a waveform of oscillator output when water is present.

Referring now to FIGS. 8 and 9, there are shown therein a waveform from the output of each of the oscillators U1A and U1B output over time. In FIG. 8, the waveform depicted is that produced when a sensor senses the absence of water, while the waveform of FIG. 9 is produced when a sensor senses the presence of water.

While a primary and preferred embodiment of the invention has been illustrated in the drawings and described above, it will be evident that various changes can be made to the invention without departing from the spirit thereof or the scope of the following claims.

Further, it will be recognized that the control system of the present invention can be utilized for monitoring and controlling unwanted water accumulation in other applications such as, for example, in fuel tanks and other vessels containing substances having a low dielectric constant.

In addition, the control system of the present invention can be utilized for monitoring liquid flow through a conduit for pumps of the type which can be damaged if run dry. In such cases, the sensors of the present invention would be located along a pump inlet conduit in such a manner that, if both sensors did not sense liquid, the pump motor would be shut off before damage to the pump occurred. The sensors in this case would monitor liquid flow through the conduit, one sensor being located nearer the pump than the other. In such a mode of operation, the pump motor would be disabled when the more remote sensor in the pump inlet conduit detected the absence of liquid in the conduit.

What is claimed is:

1. In an underground vault of the type having air therewithin and having a sump for the accumulation of water and oil distributed over the surface of the accumulated water and where said air, oil and water each possesses a dielectric constant, said vault having also a pump having a motor responsive to an electrical control signal, for removing water from said sump, a system for controlling the level of water in said vault, comprising:

first and second sensing means disposed in said sump in a spaced apart relationship for sensing the presence and absence of water in the space between said first and second sensing means by reacting to the differences in the dielectric constants of air, oil and water; and a logic circuit in electrical connection with said first sensing means and with said second sensing means and having an output for providing said electrical control signal to said pump, said electrical control signal having a first logic level turning on said pump signal when said first sensing means and said second sensing means react to the dielectric constant of water in said space and having a second logic level, turning off said pump, when said second sensing means reacts to the dielectric constant of air in said space and said first sensing means reacts to the dielectric constant of the oil on the surface of the water whereby substantially all of the water is removed from said vault while the oil is retained in said vault.

2. The system according to claim 1, wherein each of said first and second sensing means is comprised of a conductive plate forming one half of a capacitor and the water and oil serve as a conductive medium forming the other half of the capacitor of each of said first and second sensing means, the capacitance of each of said first and second sensing means changing its value of capacitance in the presence and absence of oil and water to enable said logic circuit to selectively turn said pump on and off.

3. The system according to claim 1, wherein said logic circuit includes first and second dual mode oscillators, each having an input in electrical connection with a respective one of said first and second sensing means and each oscillator generating, at an output thereof, an alternating signal having first and second duty cycles and possessing first and second DC components associated with said first and second duty cycles respectively, the first and second DC components serving to provide the first and second logic levels of said electrical control signal for turning said motor on and off, said second dual mode oscillator generating said alternating signal at said second duty cycle upon reacting to the dielectric constant of said oil.

4. The system according to claim 1, wherein said logic circuit includes first and second dual mode oscillators, each having an input electrically connected to a corresponding one of said first and second sensing means each of said first and second dual mode oscillator having an output for providing an alternating signal to a corresponding one of first and second integrators, the alternating signal of each of said first and second dual mode oscillators having a first duty cycle possessing a first DC component when an oscillator's corresponding one of said first and second sensing means reacts to the dielectric constant of water present in said space and having a second duty cycle possessing a second DC component when said second sensing means reacts to the dielectric constant of water in said space, and said first sensing means reacts to the dielectric constant of said oil, said first and second integrators having an output connected to a corresponding one of first and second inputs of a latch circuit, said latch circuit having an output connected to said pump motor, said first and second integrators extracting the first and second DC components from each integrator's alternating input signal to the corresponding one of the first and second inputs of said latch circuit to selectively change states and thereby change the logic level of said electrical control signal to turn said pump on in reaction to the presence of water in said space and to turn said pump off upon reacting to the dielectric constant of oil by said second sensing means.

5. The system according to claim 1, wherein said first and second sensing means and said logic circuit are encapsulated in an electrically nonconductive material.

6. A system for controlling a motor driven pump in water, having a first dielectric constant, air having a second dielectric constant and oil, having a third dielectric constant, and being distributed over the surface of the water, comprising:

first and second sensing means for sensing the presence and absence of water in a space, by reacting to the dielectric constants of water and air in said space, said first and second sensing means being disposed in a spaced apart relationship in said space;

logic circuit means in communication with said first and second sensing means for generating an electrical control signal having a first logic level when said first and second sensing means each react to the presence of the water in said space and having a second logic level when said second sensing means no longer senses the presence of water in said space and said first sensing means reacts to the dielectric constant of the oil, whereby the pump motor is turned on when said electrical control signal is at said first logic level and turned off when said electrical control signal is at said second logic level.

7. The system according to claim 6, wherein each of said first and second sensing means is comprised of a conductive plate forming one half of a capacitor and the water and oil serve as a conductive medium forming the other half of the capacitor of each of said first and second sensing means, the capacitance of each of said first and second sensing means changing its value of capacitance in the presence and absence of oil and water to enable said logic circuit to selectively turn said pump motor on and off.

8. The system according to claim 6, wherein said logic circuit includes first and second dual mode oscillators, each having an input in electrical connection with a respective one of said first and second sensing means and each oscillator generating, at an output thereof, an alternating signal having first and second duty cycles and possessing first and second DC components associated with said first and second duty cycles, respectively, the first and second DC components serving to provide the first and second logic levels of said electrical control circuit for turning said pump on and off, said second dual mode oscillator generating said alternating signal at said second duty cycle upon reacting to the dielectric constant of said oil.

9. The system according to claim 6, wherein said logic circuit includes first and second dual mode oscillators, each having an input electrically connected to a corresponding one of said first and second sensing means, each of said first and second dual mode oscillators having an output for providing an alternating signal to a corresponding one of first and second integrators, the alternating signal of each of said first and second dual mode oscillators having a first duty cycle possessing a first DC component when an oscillator's corresponding one of said first and second sensing means reacts to the presence of water in said space and having a second duty cycle possessing a second DC component when said second sensing means reacts to the absence of water in said space, and said first sensing means reacts to the dielectric constant of said oil, said first and second integrators having an output connected to a corresponding one of first and second inputs of a latch circuit, said latch circuit having an output connected to said pump motor, said first and second integrators extracting the first and second DC components from each integrator's alternating input signal to the corresponding one of the first and second inputs of said latch circuit to selectively change states and thereby change the logic level of said electrical control signal to turn said pump on during the reacting to the presence of water in said space and to turn said pump off upon the reacting to the dielectric constant of oil by said second sensing means.

10. The system according to claim 6, wherein said first and second sensing means and said logic circuit are encapsulated in an electrically nonconductive material.

* * * * *